United States Patent
Huang et al.

(10) Patent No.: US 7,901,872 B2
(45) Date of Patent: Mar. 8, 2011

(54) EXPOSURE PROCESS AND PHOTOMASK SET USED THEREIN

(75) Inventors: Chih-Hao Huang, Hsinchu (TW); Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 617 days.

(21) Appl. No.: 11/751,177

(22) Filed: May 21, 2007

(65) Prior Publication Data

US 2008/0292974 A1    Nov. 27, 2008

(51) Int. Cl.
G03C 5/00        (2006.01)
G03F 1/00        (2006.01)

(52) U.S. Cl. ............................................ 430/394; 430/5
(58) Field of Classification Search .............. 430/5, 311, 430/394; 438/710
See application file for complete search history.

(56) References Cited

U.S. PATENT DOCUMENTS

| | | | |
|---|---|---|---|
| 6,383,847 B1 | 5/2002 | Ditlow et al. | |
| 6,528,238 B1 * | 3/2003 | Seniuk et al. | 430/312 |
| 6,620,556 B2 * | 9/2003 | Ohsaki | 430/5 |
| 6,780,574 B2 * | 8/2004 | Kawashima | 430/394 |
| 6,898,024 B2 | 5/2005 | Takeuchi et al. | |
| 7,022,443 B2 | 4/2006 | Chandhok et al. | |
| 2003/0059685 A1 * | 3/2003 | Ohsaka | 430/5 |
| 2004/0063038 A1 * | 4/2004 | Shin et al. | 430/311 |
| 2006/0044568 A1 * | 3/2006 | Weiss | 356/509 |
| 2007/0105387 A1 * | 5/2007 | Blatchford et al. | 438/710 |

FOREIGN PATENT DOCUMENTS

| | | |
|---|---|---|
| TW | I229745 | 3/2005 |
| TW | I257532 | 7/2006 |
| TW | I270118 | 1/2007 |

* cited by examiner

*Primary Examiner* — Stephen Rosasco
*Assistant Examiner* — Stewart A Fraser
(74) *Attorney, Agent, or Firm* — J.C. Patents

(57) ABSTRACT

An exposure process is described, for defining in a photoresist layer a plurality of first patterns having a first pitch and a second pattern between them that is wider than one first pattern. A first exposure step is conducted to the photoresist layer with a first photomask that has a plurality of the first patterns without a second pattern between them, wherein the first patterns on the first photomask have the first pitch only. A second exposure step is conducted to the photoresist layer with a second photomask that has a third pattern narrower than the second pattern at a position corresponding to the second pattern. The exposure dose of the first or second exposure step alone is not sufficient to define any pattern in the photoresist layer.

10 Claims, 2 Drawing Sheets

EXPOSURE PROCESS AND PHOTOMASK SET USED THEREIN

BACKGROUND OF THE INVENTION

1. Field of the Invention

This invention relates to the photolithography technology, and more particularly relates to an exposure process to define in a photoresist layer a plurality of first patterns having a certain pitch and a wider second pattern between them without suffering from lens aberrations, and to a photomask set used in the exposure process.

2. Description of the Related Art

As the linewidth of integrated circuit (IC) process is unceasingly reduced, the accuracies in the positions and the critical dimension of a pattern/space are more and more important. The accuracy in the critical dimension of a pattern/space depends on the depth of focus, lens aberrations and so forth, wherein the lens aberrations include coma aberration that is a type of aberration where light rays from a point on the reticle do not converge to a single point in the image.

For example, when a plurality of line patterns having a pitch of about 325 nm and a wider line pattern of about 430 nm in width between them are to be defined in a photoresist layer using a single photomask having corresponding patterns in presence of coma aberration, the variation in the critical dimension of the spaces beside the wider line pattern defined in the photoresist layer may be up to about 7.5%. In the prior art, the variation can merely be reduced to about 5.5% by adding an assistant space-type feature at the middle of the wider line pattern on the photomask.

SUMMARY OF THE INVENTION

In view of the foregoing, this invention provides an exposure process to define in a photoresist layer a plurality of first patterns having a first pitch and a wider second pattern between them, which can eliminate the effects of lens aberrations to prevent variation in the critical dimensions of the patterns/spaces defined in the photoresist.

This invention also provides a photomask set that can be applied to the exposure process of this invention.

The exposure process of this invention is described as follows. A first exposure step is conducted to the photoresist layer with a first photomask that has a plurality of the first patterns without the second pattern between them, wherein the first patterns on the first photomask have the first pitch only. A second exposure step is conducted to the photoresist layer with a second photomask that has a third pattern narrower than the second pattern at a position corresponding to the second pattern. The exposure dose of the first or second exposure step alone is not sufficient to define any pattern in the photoresist layer.

The photomask set of this invention includes a first photomask and a second photomask. The first photomask has a plurality of the first patterns without the second pattern between them, wherein the first patterns on the first photomask have the first pitch only. The second photomask has a third pattern narrower than the second pattern at a position corresponding to the second pattern.

In some embodiments, the second pattern causes a second pitch being "n" (n≧2) times the first pitch, wherein n is an integer. The first patterns and the second pattern may both be line patterns.

Since lens aberrations like coma aberration do not affect patterns with only one pitch as well as the third pattern of which the transfer is affected by lens aberrations is narrower than the second pattern and defines the second pattern together with certain first patterns on the first photomask, variation in the critical dimensions of the patterns/spaces in the photoresist layer can be avoided even in the presence of lens aberrations.

It is to be understood that both the foregoing general description and the following detailed description are exemplary, and are intended to provide further explanation of the invention as claimed.

DESCRIPTION OF THE PREFERRED EMBODIMENTS

It is noted that the following embodiment is for further explaining this invention but is not intended to restrict the scope of this invention. For example, the patterns to be defined in this embodiment are line patterns, but this invention can also be applied to any other case where the first patterns and the second pattern are patterns of a different shape and/or where the second pattern can be replaced by additional first patterns in the design of the first photomask such that the first patterns on the first photomask have the first pitch only.

Figure 1:
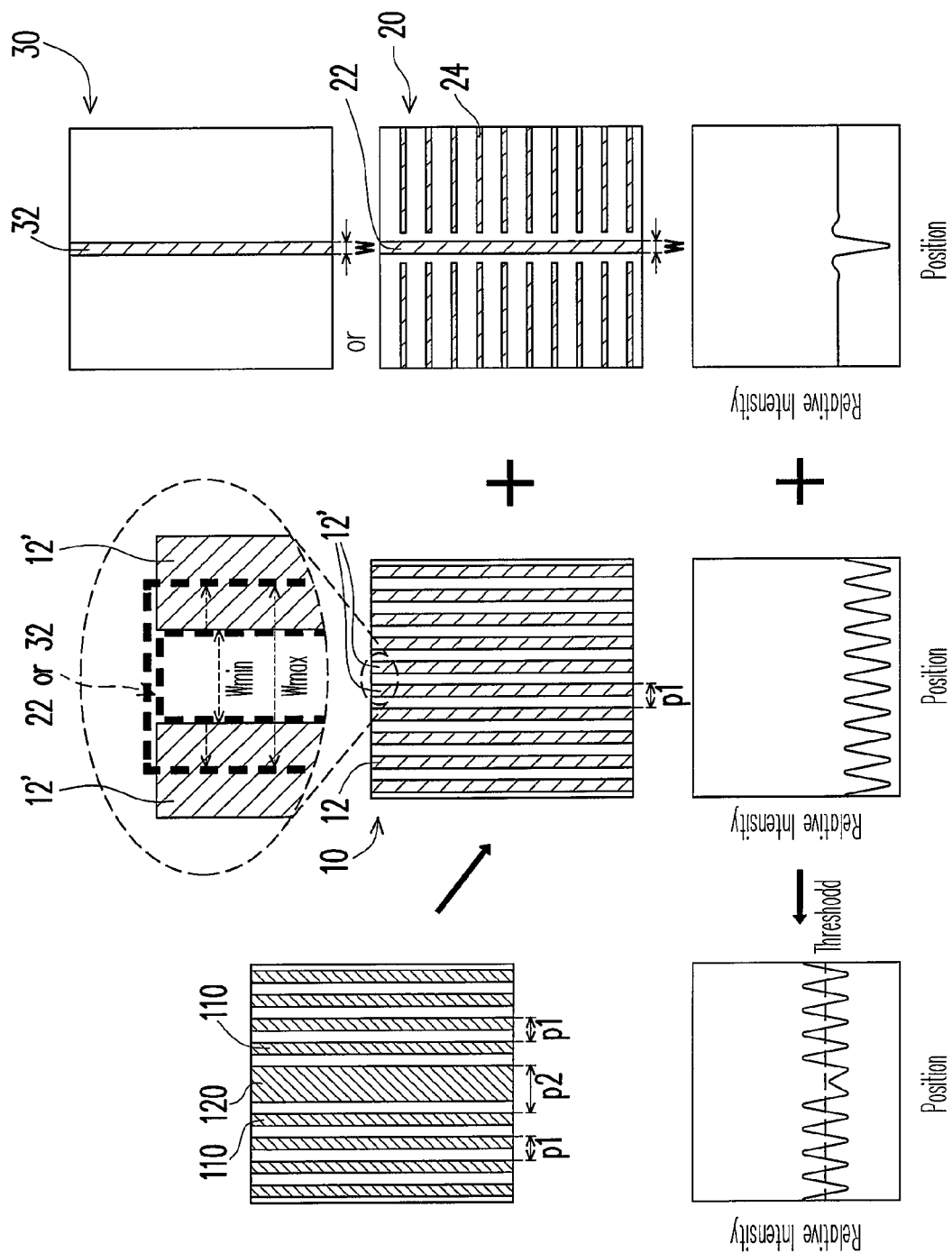
FIG. 1 illustrates a photomask set used in an exposure process according to an embodiment of this invention, the simulations of the aerial images caused by respective photomasks in the presence of coma aberration, and the combined aerial image.

FIG. 1 illustrates a photomask set used in an exposure process according to the embodiment of this invention, the simulations of the aerial images caused by respective photomasks in the presence of coma aberration, and the combined aerial image. The exposure process is for defining a plurality of first patterns 110 having a first pitch "p1" and a second pattern 120 between them that is wider than one first pattern 110. In a preferred embodiment, the wider second pattern 120 causes a second pitch "p2" that is "n" (n≧2) times the first pitch "p1", wherein n is an integer.

In some cases, the first pitch "p1" is two times the width of each first pattern 110, the second pitch "p2" is two times the first pitch "p1", and the width of the second pattern 120 is three times the width of each first pattern 110. Such a pattern configuration can be found in the STI layer of an IC device, for example.

The photomask set for defining the first patterns 110 and the second pattern 120 in a photoresist layer in an exposure process includes a first photomask 10 and a second photomask 20 or 30. The first photomask 10 is applied in a first exposure step of the exposure process, and the second photomask 20 or 30 applied in a second exposure step of the exposure process.

The first photomask 10 has a plurality of the first patterns 110 without a second pattern 120 between them, wherein the first patterns 110 on the first photomask 10 have the first pitch "p1" only. The second photomask 20 (or 30) has a third pattern 22 (or 32) narrower than the second pattern at a position corresponding to the second pattern 120, wherein the second photomask 20 further has a plurality of fourth patterns 24 with a dimension beyond the resolution of the exposure process for adjusting the intensity of light passing the second photomask 20. The fourth patterns 24 may be linear patterns that are too thin to be transferred onto the photoresist layer in the exposure process.

In addition, when the first patterns 110 and the second pattern 120 both are line patterns and the second pattern 120 causes a second pitch "p2" that is "n" (n≧2) times the first pitch "p1" with n being an integer, the first photomask 10 includes "n" more first patterns 12' other than the first patterns 12 corresponding to the first patterns 110 to be defined in the photoresist layer. In such a case, the width of the third pattern 22 or 32 is between a first width "$w_{min}$" and a second width "$w_{max}$" larger than the first width. The first width "$w_{min}$" is the width at which the two borders of the third pattern 22 or 32 respectively coincide with respective inner borders of the two outmost ones of the "n" more first patterns 12' when the second photomask 20 or 30 is superimposed on the first photomask 10. The second width "$w_{max}$" is the width at which the two borders of the third pattern 22 or 32 respectively coincide with respective central lines of the two outmost ones of the "n" more first patterns 12' when the second photomask 20 or 30 is superimposed on the first one 10.

Referring to the simulations of the aerial images caused by the two photomasks 10 and 20 (or 30) in the presence of coma aberration and the threshold level of exposure dose in the plot of the combined aerial image shown left, it is noted that the exposure dose of the first or second exposure step alone is not sufficient to define any pattern in the photoresist layer. The patterns are not defined until both of the first and the second exposure steps are finished. It is also noted that the first exposure step can be conducted before or after the second one, because the resulting combined aerial images are the same in both cases.

Moreover, the exposure dose of the first exposure step may be substantially the same as that of the second exposure step, as shown in FIG. 1, or be different from the latter in a certain degree for fine adjustment. The width of the third pattern 22 or 32, the area occupied by the fourth patterns for adjusting light intensity and the exposure doses of the two exposure steps can be optimized together to meet the real requirements.

Figure 2A:
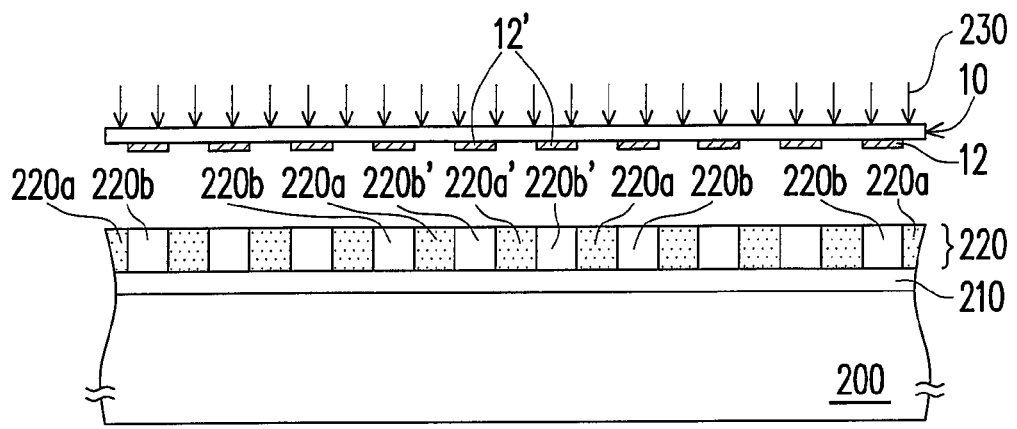
FIGS. 2A and 2B illustrate an exemplary exposure process using the above photomask set according to the embodiment of this invention.
Figure 2B:
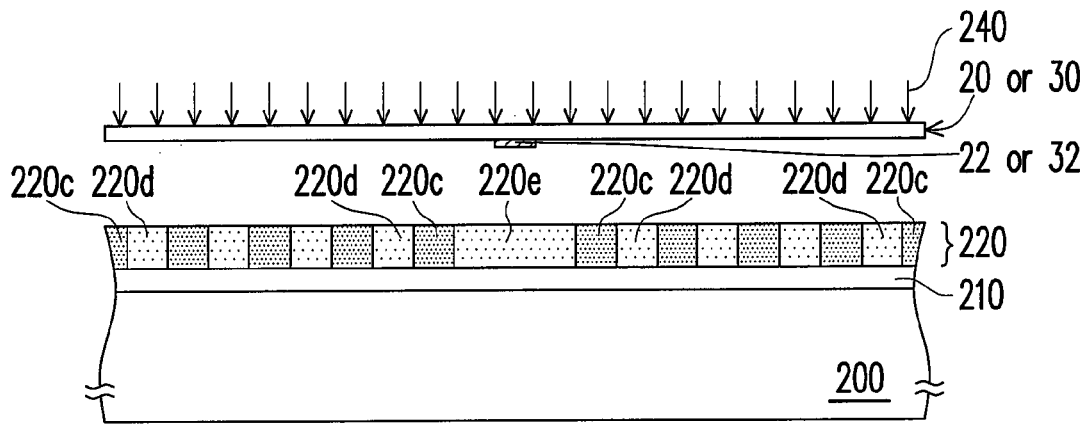
Figure 2C:
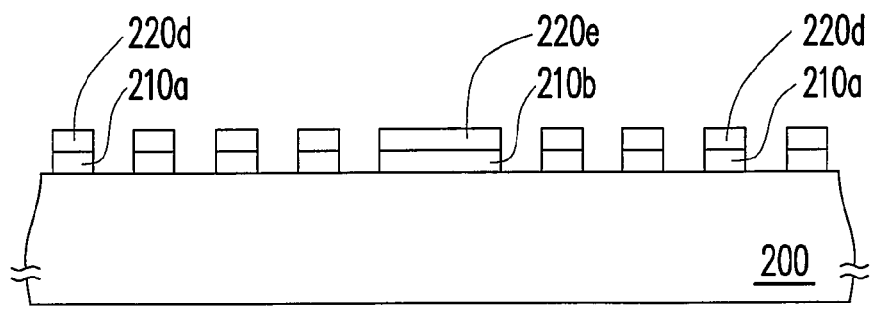
FIG. 2C illustrates the resulting structure after subsequent development and etching steps.

FIGS. 2A and 2B illustrate an exemplary exposure process using the above photomask set according to the embodiment of this invention, and FIG. 2C illustrates the resulting structure after subsequent development and etching steps. The exposure process may be conducted in presence of lens aberrations including coma aberration.

Referring to FIG. 2A, the photomask 10, which has thereon a plurality of the first patterns 12 including two more first patterns 12' than the first patterns to be defined, is used in a first exposure step 230 to form semi-exposed regions 220a and unexposed regions 220b in a positive photoresist layer 220 that is coated on a target layer 210 formed on a substrate 200, wherein the term "semi-exposed" indicates that the exposure dose of the first exposure step alone is not sufficient to define any pattern in the photoresist layer 220. The semi-exposed region 220a' and the two non-exposed regions 220b' beside 220a' together correspond to the second pattern that is to be defined in the photoresist layer 220. In addition, the material of the target layer 210 may be poly-Si or metal.

Referring to FIG. 2B, the photomask 20 or 30 that has the third pattern 22 or 32 with the above-defined first width "$w_{min}$", for example, is used in a second exposure step 240. After the second exposure step 240, the semi-exposed region 220a' shown in FIG. 2A is still a semi-exposed region as being masked by the third pattern 22 or 32 in the second exposure step 240. However, the semi-exposed regions 220a are converted to fully exposed regions 220c and the unexposed regions 220b to semi-exposed regions 220d, wherein the unexposed regions 220b' beside the semi-exposed region 220a' are converted to two corresponding semi-exposed regions that constitute, together with the semi-exposed region 220a', a wider semi-exposed region 220e.

Referring to FIG. 2C, after the above double exposure process, a development step is conducted to remove the fully exposed regions 220c. An etching process is then conducted to etch the target layer 210 using the remaining semi-exposed regions 220d and 220e as a mask to form a plurality of first patterns 210a and a second pattern 210b, which respectively correspond to the first patterns 110 and the second pattern 120 in FIG. 1.

In an example where a plurality of line patterns having a pitch of about 325 nm and a wider line pattern of about 430 nm in width between them were defined in a photoresist layer using a photomask set of this invention in presence of coma aberration, the variation in the critical dimension of the spaces beside the wider line pattern defined in the photoresist layer were reduced to about 1.1%-3% (<5.5%, 7.5% in the prior art).

Moreover, although the above embodiment of this invention utilizes a positive photoresist layer to define patterns of different widths, this invention is also applicable to a case where a negative photoresist is used to define patterns of different widths, where a positive photoresist is used to define openings with different distances or where a negative photoresist is used to define openings with different distances, with a suitable photomask set that is designed according to the above-mentioned rules of this invention.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An exposure process for defining, in a photoresist layer, a plurality of first patterns having a first pitch and a second pattern between the first patterns that is wider than one first pattern, comprising:
    conducting a first exposure step to the photoresist layer with a first photomask, which has a plurality of the first patterns without the second pattern between them, wherein the first patterns on the first photomask have the first pitch only; and
    conducting a second exposure step to the photoresist layer with a second photomask, which has a third pattern narrower than the second pattern at a position corresponding to the second pattern,
    wherein an exposure dose of the first or second exposure step alone is not sufficient to define any pattern in the photoresist layer.

2. The exposure process of claim 1 being conducted in presence of lens aberrations.

3. The exposure process of claim 2, wherein the lens aberrations include coma aberration.

4. The exposure process of claim 1, wherein the first exposure step is conducted before or after the second exposure step.

5. The exposure process of claim 1, wherein the second photomask further has, beside the third pattern, a plurality of fourth patterns having a dimension beyond a resolution of the exposure process for adjusting intensity of light passing the second photomask.

6. The exposure process of claim 1, wherein the second pattern causes a second pitch that is "n" (n≧2) times the first pitch, and n is an integer.

7. The exposure process of claim 1, wherein the first patterns and the second pattern are line patterns.

8. The exposure process of claim 7, wherein the second pattern causes a second pitch that is "n" (n≧2) times the first pitch, and n is an integer.

9. The exposure process of claim 8, wherein the first photomask includes "n" more first patterns than the first patterns to be defined in the photoresist layer, a width of the third pattern is between a first width and a second width larger than the first width, the first width is the width at which two borders of the third pattern respectively coincide with respective inner borders of two outmost ones of the "n" more first patterns when the second photomask is superimposed on the first photomask, and the second width is the width at which two borders of the third pattern respectively coincide with respective central lines of the two outmost ones of the "n" more first patterns when the second photomask is superimposed on the first photomask.

10. The exposure process of claim 1, wherein the exposure dose of the first exposure step is equal to the exposure dose of the second exposure step.

* * * * *